(12) United States Patent
Wong et al.

(10) Patent No.: US 11,217,992 B2
(45) Date of Patent: Jan. 4, 2022

(54) HIGH-SPEED SHORT-TO-GROUND PROTECTION CIRCUIT FOR PASS FIELD-EFFECT TRANSISTOR (FET)

(71) Applicant: TEXAS INSTRUMENTS INCORPORATED, Dallas, TX (US)

(72) Inventors: Kae Ann Wong, Allen, TX (US); Siang Tong Tan, Dallas, TX (US); Luis Ariel Malave-Perez, Dallas, TX (US); Mikko Topi Loikkanen, Oulu (FI); Mitsuyori Saito, Plano, TX (US); Angelo William Pereira, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/843,324

(22) Filed: Apr. 8, 2020

(65) Prior Publication Data
US 2021/0091562 A1    Mar. 25, 2021

Related U.S. Application Data

(60) Provisional application No. 62/903,508, filed on Sep. 20, 2019.

(51) Int. Cl.
*H02H 9/04*     (2006.01)
*H02H 1/00*     (2006.01)

(52) U.S. Cl.
CPC .......... *H02H 9/046* (2013.01); *H02H 1/0007* (2013.01)

(58) Field of Classification Search
CPC .............................. H02H 9/046; H02H 1/0007

USPC .................................................... 361/56, 91.1
See application file for complete search history.

(56) References Cited

U.S. PATENT DOCUMENTS

| | | | |
|---|---|---|---|
| 6,922,321 B2 | 7/2005 | Katoh et al. | |
| 7,944,663 B2 | 5/2011 | Morino | |
| 8,174,251 B2 | 5/2012 | Kimura | |
| 8,384,370 B2 | 2/2013 | Nakashimo | |
| 9,429,971 B2 * | 8/2016 | Mallala | G05F 1/569 |
| 2009/0267694 A1 * | 10/2009 | Vice | H03F 3/45183 |
| | | | 330/261 |
| 2012/0262137 A1 | 10/2012 | Arigliano et al. | |

(Continued)

FOREIGN PATENT DOCUMENTS

CN         106575865 A     4/2017

*Primary Examiner* — Dharti H Patel
(74) *Attorney, Agent, or Firm* — Valerie M. Davis; Charles A. Brill; Frank D. Cimino

(57) ABSTRACT

A system includes a power supply source and a power control circuit coupled to the power supply source, in which the power control circuit includes a pass field-effect transistor (FET). The system also includes a short-to-ground protection circuit coupled to an output of the pass FET. The short-to-ground protection circuit includes a sense circuit configured to detect when a magnitude and a change rate of a voltage drop at the output of the pass FET is greater than respective thresholds. The short-to-ground protection circuit also includes a control node at the output of the sense circuit. The sense circuit is configured to induce a control current at the control node in response to the magnitude and the change rate of a voltage drop at the output of the pass FET being greater than respective thresholds. The control current is used to turn off the pass FET.

21 Claims, 6 Drawing Sheets

(56) References Cited

U.S. PATENT DOCUMENTS

2015/0244260 A1\* 8/2015 Xu ........................ H02M 3/156
  315/209 R

\* cited by examiner

HIGH-SPEED SHORT-TO-GROUND PROTECTION CIRCUIT FOR PASS FIELD-EFFECT TRANSISTOR (FET)

CROSS-REFERENCE TO RELATED APPLICATIONS

This application claims priority to U.S. Provisional Application No. 62/903,508, filed Sep. 20, 2019, which is hereby incorporated by reference.

BACKGROUND

The proliferation of consumer electronic devices and integrated circuit (IC) technology has resulted in the commercialization of IC products. As new consumer electronic devices are developed and IC technology advances, new IC products are commercialized. One example IC product that is needed in consumer electronic devices is a low dropout regulator (LDO). An example LDO topology uses a pass field-effect transistor (FET) transistor controlled by an error amplifier to linearly regulate an output voltage to a load based on an input voltage, where the input voltage is the same or greater than the output voltage. Another example IC product that is needed in consumer electronic devices is a power switch, where the power switch connects to a load to a power source.

During an LDO or power switch on state, if there is an output short-to-ground event, it can damage the pass field-effect transistor (FET) due to high FET current surge. More specifically, for an n-type metal-oxide-semiconductor (NMOS) pass transistor, when the LDO or power switch output is shorted to ground, the NMOS pass FET's gate-to-source voltage ($V_{GS}$) increases instantaneously and results in extremely high instantaneous drain-to-source current. For PMOS type pass FET, the same scenario can happen if the pass FET's drain-to-source voltage ($V_{DS}$) change causes the FET operating point to transition from linear region to saturation region.

SUMMARY

In accordance with at least one example of the disclosure, a system comprises a power supply source and a power control circuit coupled to the power supply source, in which the power control circuit includes a pass field-effect transistor (FET). The system also comprises a short-to-ground protection circuit coupled to an output of the pass FET. The short-to-ground protection circuit includes a sense circuit configured to detect when a magnitude and a change rate of a voltage drop at the output of the pass FET is greater than respective thresholds. The short-to-ground protection circuit also includes a control node at the output of the sense circuit. The sense circuit is configured to induce a control current at the control node in response to the magnitude and the change rate of a voltage drop at the output of the pass FET being greater than respective thresholds. The control current is used to turn off the pass FET.

In accordance with at least one example of the disclosure, an integrated circuit comprises a power supply node and a power control circuit coupled to the power supply node, where the power control circuit includes a pass FET. The integrated circuit also comprises a short-to-ground protection circuit coupled to an output of the pass FET. The short-to-ground protection circuit includes a sense circuit coupled to the output of the pass FET and configured to induce a control current in response to a magnitude and a change rate of a voltage drop at the output of the pass FET being greater than respective thresholds. The control current is used to turn off the pass FET.

In accordance with at least one example of the disclosure, a circuit comprises a pass FET and a short-to-ground protection circuit coupled to an output of the pass FET. The short-to-ground protection circuit includes: a transistor; a resistor coupled between a gate of the transistor and an output of the pass FET; a capacitor coupled between the gate of the transistor and a ground node; and a current source coupled to the gate of the transistor. A first current terminal of the transistor is coupled to a control node, and a second current terminal of the transistor is coupled to the output of the pass FET.

BRIEF DESCRIPTION OF THE DRAWINGS

For a detailed description of various examples, reference will now be made to the accompanying drawings in which.

DETAILED DESCRIPTION

Disclosed herein is a short-to-ground protection circuit for a power control circuit (e.g., a low dropout regulator (LDO) or power switch) with a pass field-effect transistor (FET). The proposed short-to-ground protection circuit is configured to sense both the magnitude and the change rate of the pass FET's output voltage drop. When the short-to-ground protection circuit is triggered (e.g., due to the sensed magnitude and the sensed change rate of the pass FET's output voltage drop being greater than respective thresholds), the short-to-ground protection circuit will turn off the pass FET by reducing the gate-to-source voltage ($V_{GS}$) to sharply reduce the duration of the potential current surge. The proposed short-to-ground protection circuit has a fast reaction time that provides suitable short-to-ground protection for a pass FET in compliance with integrated circuit (IC) limitations.

In one example, the proposed short-to-ground protection circuit is implemented with an n-type metal-oxide-semiconductor (NMOS) transistor whose source is connected to the output of the pass FET. The gate of the NMOS transistor is connected to a resistor-capacitor (RC) delayed version of the same output of the pass FET. Also, a programmable direct current (DC) current is injected into the same resistor at the gate side to adjust the trigger voltage on top of the existing NMOS transistor's threshold voltage. When the output of the pass FET is shorted to ground, the NMOS transistor's source will drop faster than its gate which is low pass filtered. If the drop is greater than the trigger voltage, the NMOS transistor will turn on and induce a current which can be used directly or indirectly to turn off the pass FET. In some example embodiments, an optional gain stage is used to amplify the induced current and/or to change the polarity of the induced current. In other examples, a digital signal generator is used to convert the induced current to a digital signal that is used to turn off the pass FET. To provide a better understanding, various LDO circuit options and related systems or scenarios are described using the figures as follows.

Figure 1:
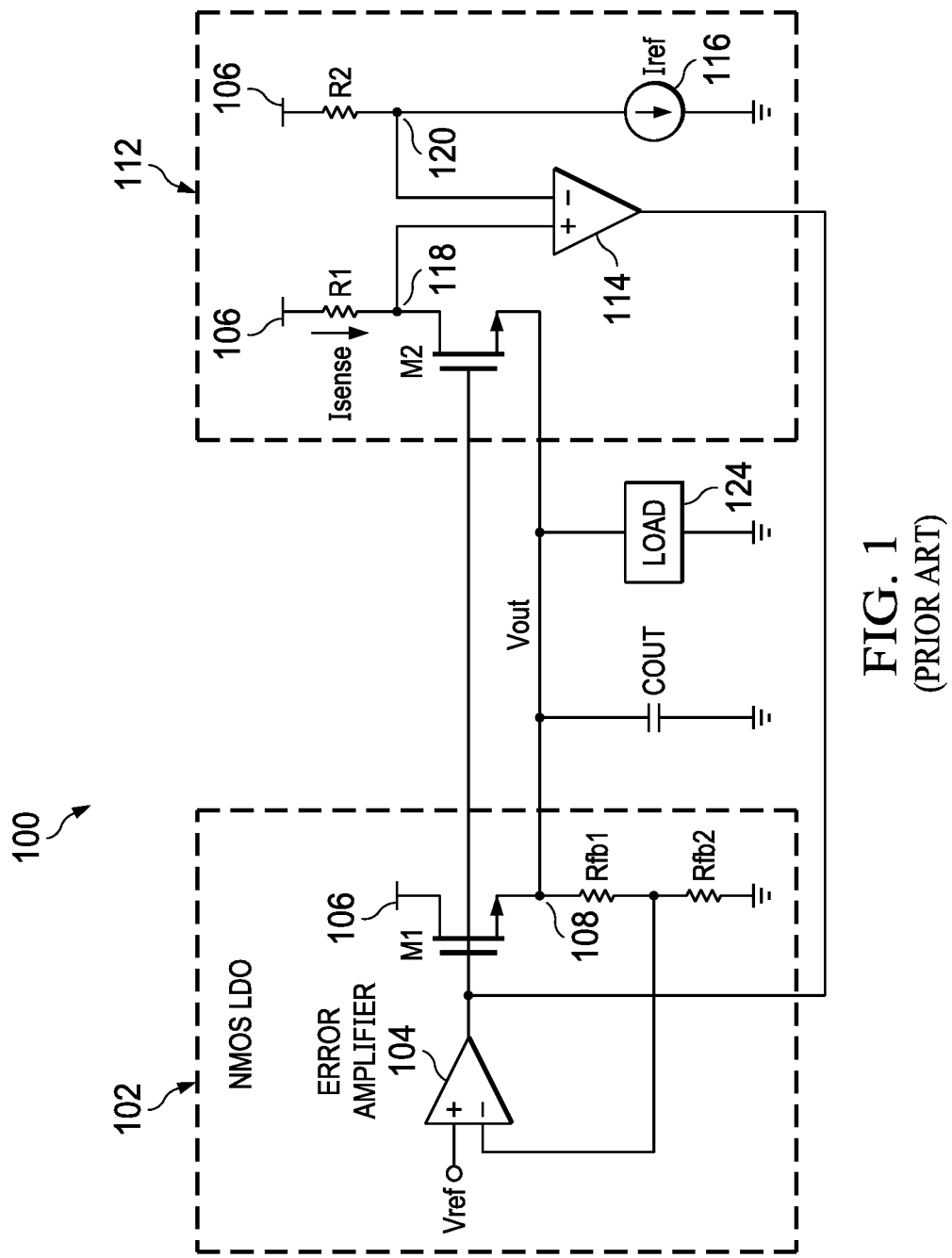
FIG. 1 is a schematic diagram showing a circuit with a low dropout regulator (LDO) and a current limit circuit in accordance with conventional circuitry.

FIG. 1 is a schematic diagram showing a circuit 100 with an LDO 102 and a current limit circuit 112 in accordance with conventional circuitry. As shown, the LDO 102 includes an error amplifier 104, where an output of the error amplifier 104 is coupled to the control terminal of an NMOS pass FET (M1). In the example of FIG. 1, the first current terminal of M1 is coupled to a voltage supply node 106, and the second current terminal of M1 is coupled to an output node 108 of the LDO 102. In the example of FIG. 1, the output node 108 is coupled the current limit circuit 112, an output capacitor (COUT), and a load 124 in parallel with COUT, where the LDO 102 is configured to regulate power to the load 124 using the error amplifier 104. As shown, the positive input node of the error amplifier 104 receives a reference voltage (Vref), while the negative input node of the error amplifier 104 receives a scaled version of the output voltage (Vout) at the output node 108. More specifically, the scaling of Vout is based on a voltage divider formed using resistors (e.g., Rfb1, Rfb2) between the output node 108 and a ground node.

In the example of FIG. 1, the current limit circuit 112 includes sense transistor M2, where M2 has a control terminal coupled to the control terminal of M1, a first current terminal coupled to sense node 118, and a second current terminal coupled to the output node 108 of the LDO 102. More specifically, the sense node 118 is coupled to the voltage supply node 106 via a resistor (R1). The sense node 118 is also coupled to the positive input node of an operational amplifier 114. As shown, the negative input node of the operational amplifier 114 is coupled to a reference node 120, where the voltage at the reference node is a function of a reference current (Iref) source 116, a voltage at the voltage supply node 106, and a resistor (R2). The output of the operational amplifier 114 is coupled to the gate of M1. In operation, the current limit circuit 112 is configured to detect when the output node 108 of the LDO 102 is shorted to ground and to sink current from the gate of M1 in response. However, the current limit circuit 112 may not be fast enough to limit the current to prevent damage to M1 (resulting from heat due to excessively long duration and high current flow) in a short-to-ground event when IC limitations are considered.

Figure 2:
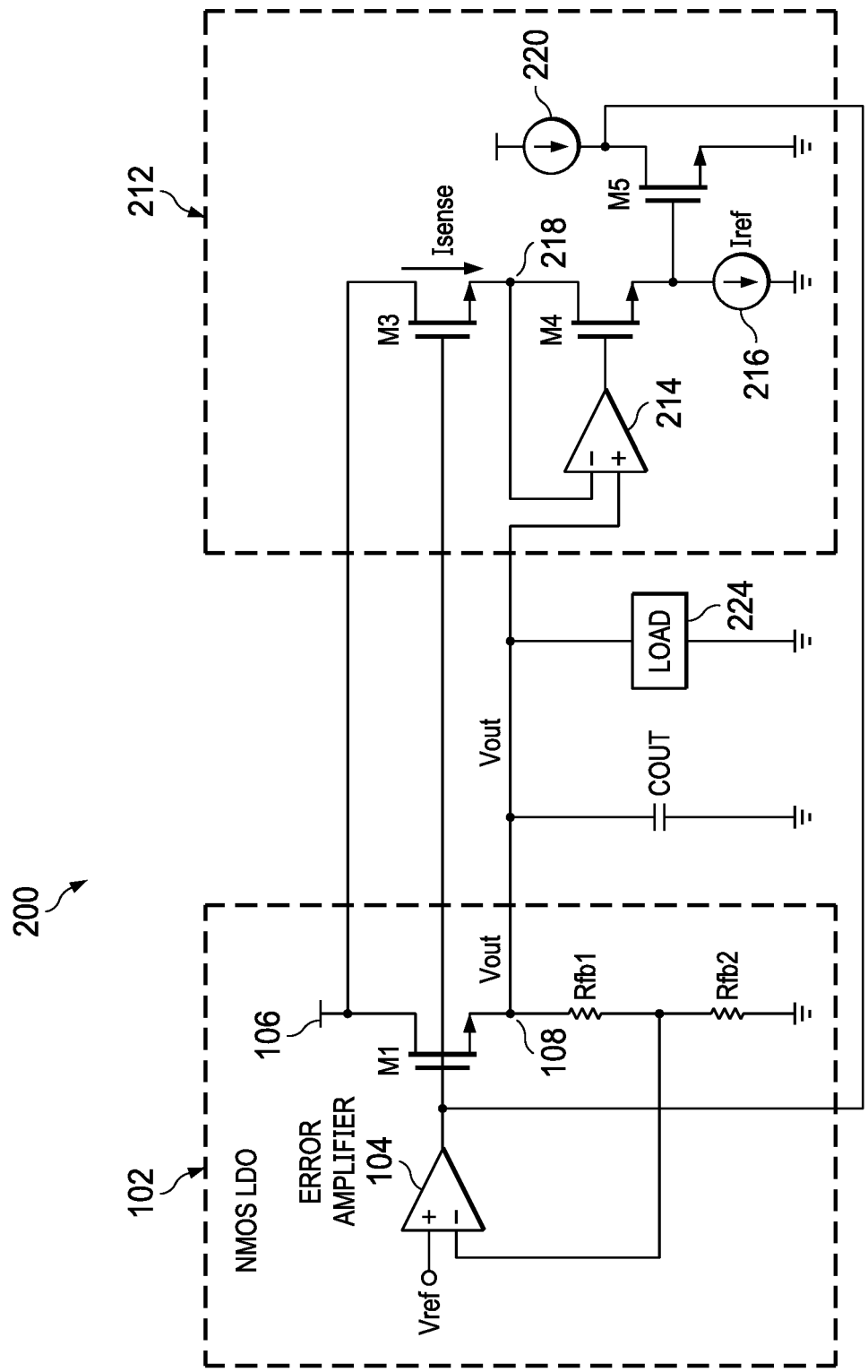
FIG. 2 is a schematic diagram showing a circuit with the LDO of FIG. 1 and a current limit circuit in accordance with conventional circuitry.

FIG. 2 is a schematic diagram showing a circuit 200 with the LDO 102 of FIG. 1 and another current limit circuit 212 in accordance with conventional circuitry. In the example of FIG. 2, the output node 108 of the LDO 102 is coupled the current limit circuit 212, COUT, and a load 224 in parallel with COUT, where the LDO 102 is configured to regulate power to the load 224 using the error amplifier 104.

In the example of FIG. 2, the current limit circuit 212 includes sense transistor M3 with a control terminal coupled to the control terminal of M1, with a first current terminal coupled to voltage supply node 106, and with a second current terminal coupled to a sense node 218. More specifically, the sense node 218 is coupled to the first current terminal of transistor M4, and to the negative input node of an operational amplifier 214. As shown, the positive input node of the operational amplifier 214 is coupled to the output node 108 of the LDO 102. Also, the second current terminal of M4 is coupled to a reference current source 216 and to the control terminal of transistor M5. As shown, the first current terminal of M5 is coupled to a current source 220 and to the gate of M1, and the second current terminal of M5 is coupled to a ground node.

In operation, the current limit circuit 212 is configured to detect when the output node 108 of the LDO 102 is shorted to ground and to sink current from the gate of M1 in response. However, the current limit circuit 212 may not be fast enough to limit the current to avoid damage to M1 in a short-to-ground event when IC limitations are considered.

Figure 3:
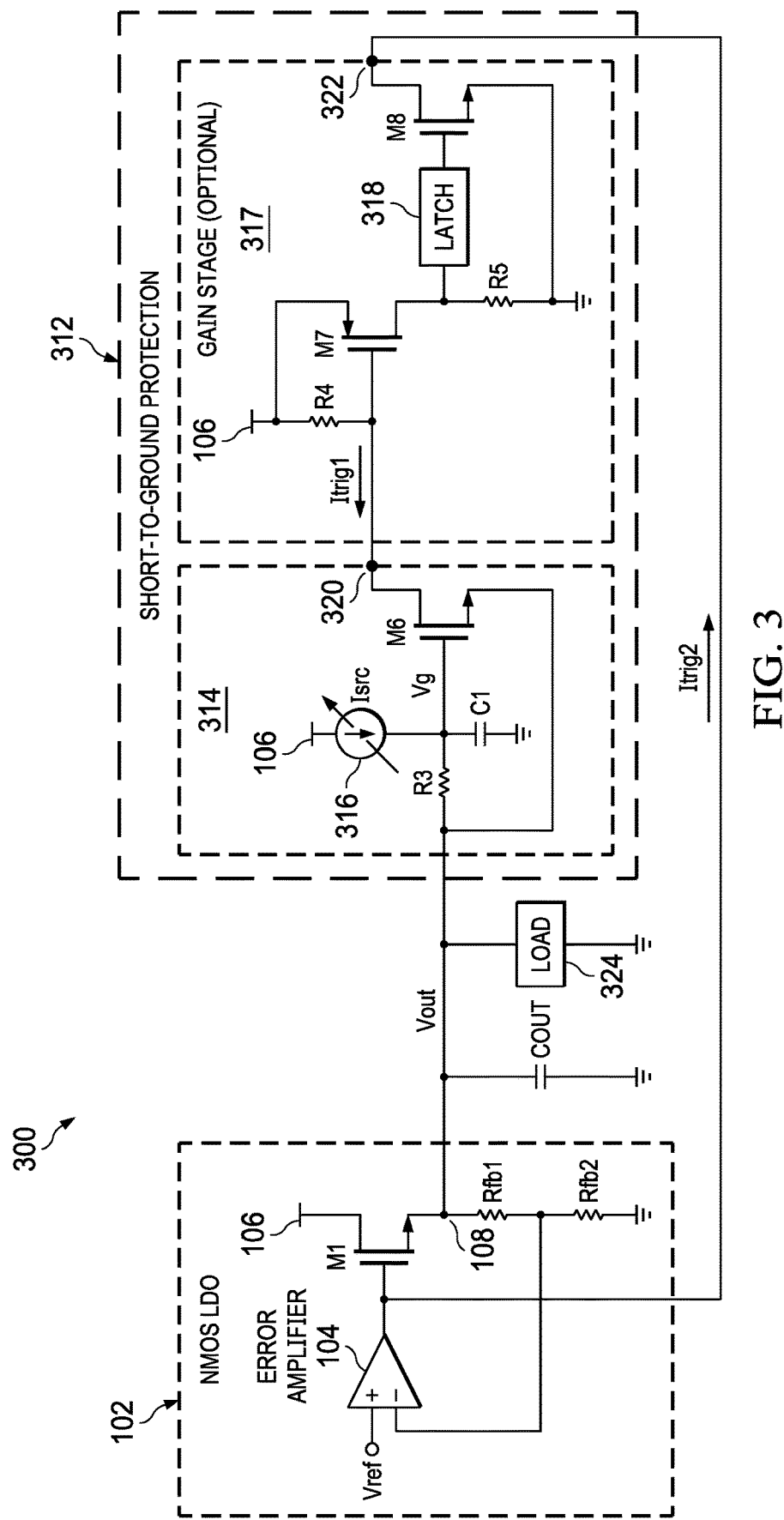
FIG. 3 is a schematic diagram showing a circuit with the LDO of FIG. 1 with a short-to-ground protection circuit in accordance with an example embodiment.

FIG. 3 is a schematic diagram showing a circuit 300 with the LDO 102 of FIG. 1 and a short-to-ground protection circuit 312 in accordance with an example embodiment. In the example of FIG. 3, the output node 108 of the LDO 102 is coupled the short-to-ground protection circuit 312, COUT, and a load 324 in parallel with COUT, where the LDO 102 is configured to regulate power to the load 324 using the error amplifier 104.

As shown, the short-to-ground protection circuit 312 includes a sense circuit 314 configured to detect when a magnitude and a change rate of a voltage drop at the output of M1 (the pass FET) is greater than respective thresholds for the magnitude and the change rate. The short-to-ground protection circuit 312 also includes a control node 320 at the output of the sense circuit 314, where the sense circuit 314 is configured to induce a control current (Itrig1 in FIG. 3) at the control node 320 in response to the magnitude and the change rate of a voltage drop at the output of M1 being greater than respective thresholds for the magnitude and the change rate, and where the control current is used to turn off M1.

In the example embodiment of FIG. 3, the sense circuit 314 includes a transistor (M6) and a resistor (R3) coupled between a gate of the transistor and an output of M1. The sense circuit 314 also includes a capacitor (C1) coupled between the gate of M6 and a ground node. The sense circuit 314 also includes a current (Isrc) source 316 coupled to the gate of M6, where a first current terminal of M6 is coupled to the control node 320, and where a second current terminal of M6 is coupled to the output of M1. In operation, R3 and C1 provide a delayed version of Vout to the control terminal of M6, where the delay is acting as the change rate detection threshold. Also, Isrc and R3 generate a positive or negative offset to adjust the trigger voltage on top of the existing threshold voltage for M6. The delay and the trigger voltage are selected based on an expected load transient response during normal operation versus short-to-ground event. In some example embodiments, the current source 316 is programmable, which enables adjustments to or calibration of the magnitude thresholds.

In the example embodiment of FIG. 3, the short-to-ground protection circuit 312 also includes a gain stage 317 coupled to the control node 320, where an output of the gain stage 317 is coupled to the gate of the pass FET. In some example embodiments, the gain stage 317 includes a first transistor (M7) with a control terminal coupled to the control node 320, with a first current terminal coupled to a power supply source (e.g., the voltage supply node 106), and with a second current terminal coupled to a control terminal of a second transistor (M8). The gain stage 317 also includes a first resistor (R4) coupled between the voltage supply node 106 and the control node 320. The gain stage 317 also includes a second resistor (R5) coupled between the second current terminal of M7 and a ground node. Also, a first current terminal of M8 is coupled to a control terminal of M1, and a second current terminal of M8 is coupled to the ground node.

In the example of FIG. 3, M7, M8, R4, and R5 form a high-speed gain stage, which amplifies and/or changes the polarity of the induced current at the control node 320. A latch can be implemented at gate of M8 if needed. More specifically, in the example of FIG. 3, the gain stage 317 also includes a latch 318 coupled between the second current terminal of M7 and the control terminal of M8. With the latch 318, the induced current (Itrig2) at the first terminal of M8 stays high to keep M1 turned off, which is helpful for certain types of gate control circuitry and/or error amplifier circuitry coupled to the control terminal of M1. In other example embodiments, the latch 318 can be omitted.

In operation, the short-to-ground protection circuit 312 is configured to detect when the output node 108 of the LDO 102 is shorted to ground and to sink current from the gate of M1 in response. Specifically, Vout will drop much faster than the gate voltage (Vg, the voltage at the control terminal of M6), and hence turn on M6 and generate Itrig1 which will be amplified to Itrig2 at the output node 322 of the gain stage 317. Itrig2 pulls down the gate of M1, resulting in M1 being turned off. In some example embodiments, the proposed short-to-ground protection circuit 312 is able to reduce the duration of the power FET current spike due to a short-to-ground event to below 150 ns.

With the sense circuit 314, the short-to-ground protection circuit 312 is sufficiently fast to avoid damage to M1 in a short-to-ground event when IC limitations are considered. To increase the amount of current that is sunk from the gate of M1, the gain stage 517 is an option, where the speed of the gain stage 317 is sufficiently fast to sink current in a manner that avoids damage to M1 in a short-to-ground event when IC limitations are considered.

Figure 4:
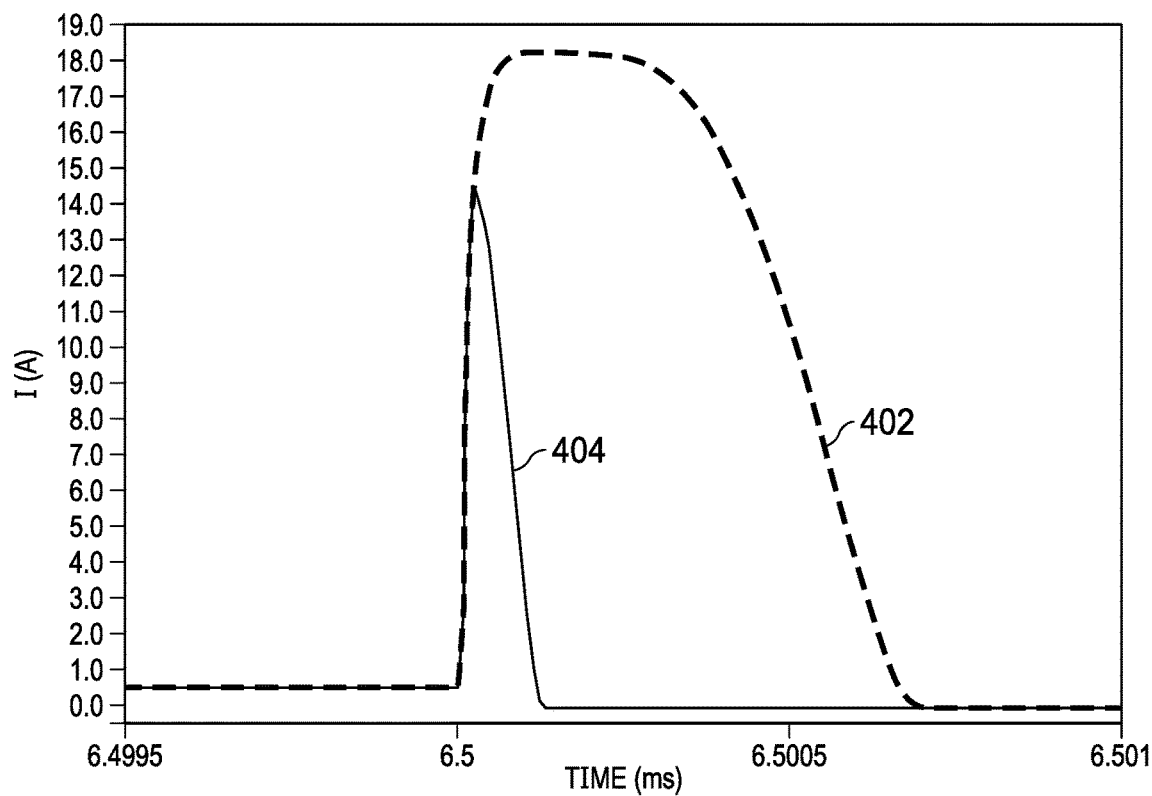
FIG. 4 is a graph showing current as a function of time with and without the proposed short-to-ground protection circuit in accordance with some examples.

FIG. 4 is a graph 400 showing current as a function of time with and without the proposed short-to-ground protection circuit in accordance with some examples. In graph 400, curve 402 represents current flow through a pass FET (e.g., M1) if only a current limit circuit (e.g., the current limit circuit 112 in FIG. 1, or the current limit circuit 212 in FIG. 2) is used. With only a current limit circuit as in curve 402, the amount of current flow through M1 in the event of a short-to-ground scenario may be sufficient to damage M1 when IC limitations are considered. In contrast, curve 404 represents current flow through a pass FET (e.g., M1) when the proposed short-to-ground protection circuit (e.g., the short-to-ground protection circuit 312 of FIG. 3) is used. With a proposed short-to-ground protection circuit as in curve 404, the duration and the amount of current flow through M1 in the event of a short-to-ground scenario is reduced, which prevents damage to M1 (the reduction of current magnitude and duration reduces the amount of heat generated) when IC limitations are considered.

Figure 5:
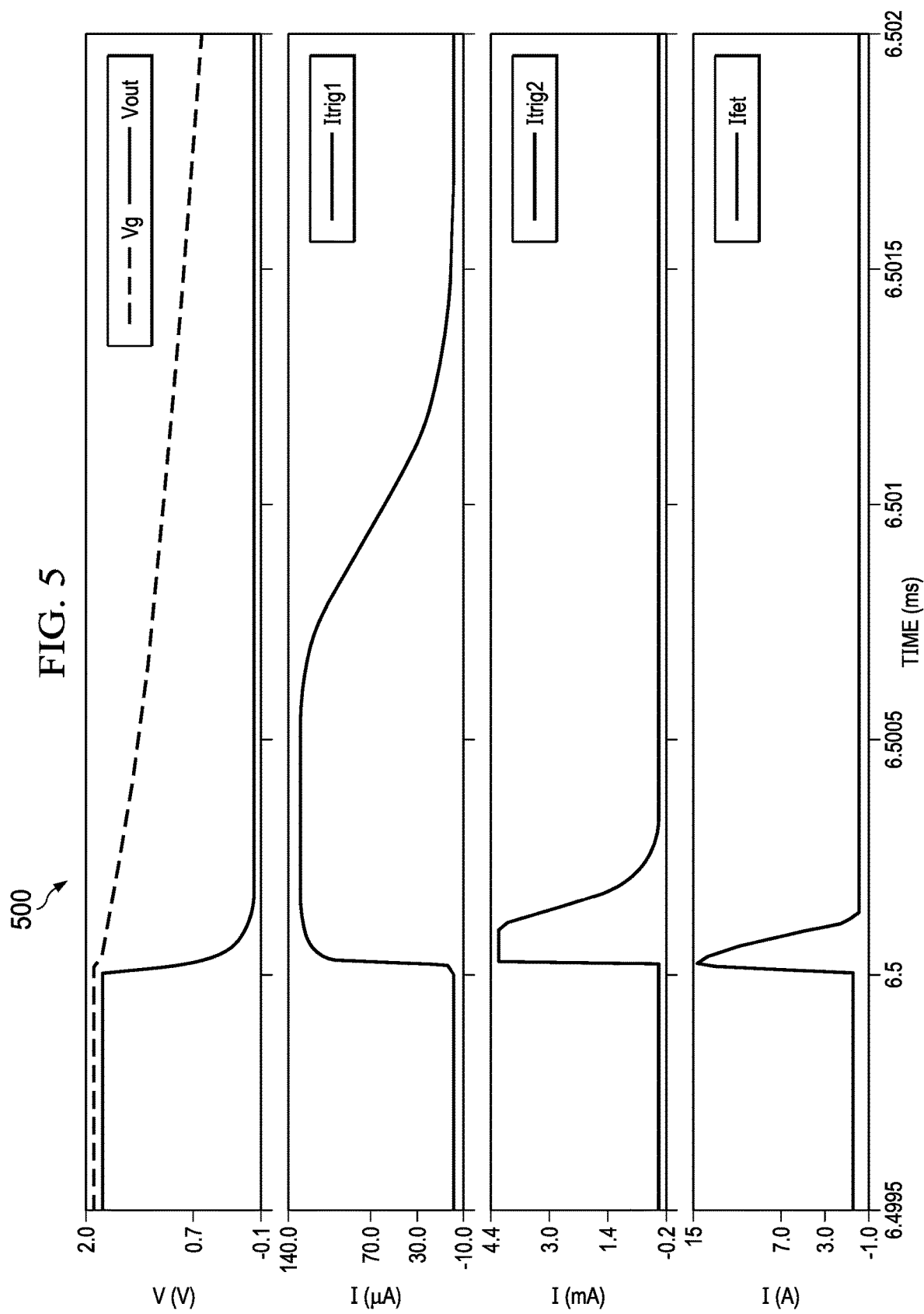
FIG. 5 is a graph showing waveforms for an LDO and short-to-ground protection circuit in accordance with an example embodiment.

FIG. 5 is a graph 500 showing waveforms for an LDO (e.g., the LDO 102) and a short-to-ground protection circuit (e.g., the short-to-ground protection circuit 312). In the graph 500, waveforms for Vout, Vg, Itrig1, Itrig2, and Ifet (the current through the pass FET) are represented. The Vout waveform corresponds to the voltage at the output node (e.g., the output node 108) of an LDO as a function of time. The Vg waveform represents the voltage at the control terminal of a sense circuit transistor (e.g., M6 of the sense circuit 314 in FIG. 3) in a short-to-ground protection circuit (e.g., the short-to-ground protection circuit 312 in FIG. 3) as a function of time. The Itrig1 waveform represents the induced current at a control node (e.g., the control node 320) of a sense circuit (e.g., the sense circuit 314 in a short-to-ground protection circuit (e.g., the short-to-ground protection circuit 312 in FIG. 3) as a function of time. The Itrig2 waveform represents the induced current at an output node (e.g., the output node 322) of a gain stage (e.g., the gain stage 317) in a short-to-ground protection circuit (e.g., the short-to-ground protection circuit 312 in FIG. 3) as a function of time. The Ifet waveform represents the current through the pass FET (e.g., M1) as a function of time. As shown in graph 500, when Vout begins to drop, Vg drops, resulting in Itrig1 and Itrig2 going high for a time. Itrig2 being high causes the gate voltage of the pass FET to drop quickly. So even though Ifet begins to increase in response to a short-to-ground event, the proposed short-to-ground protection circuit (e.g., the short-to-ground protection circuit 312 in FIG. 3) causes the pass FET to be turned off before damage occurs.

Figure 6:
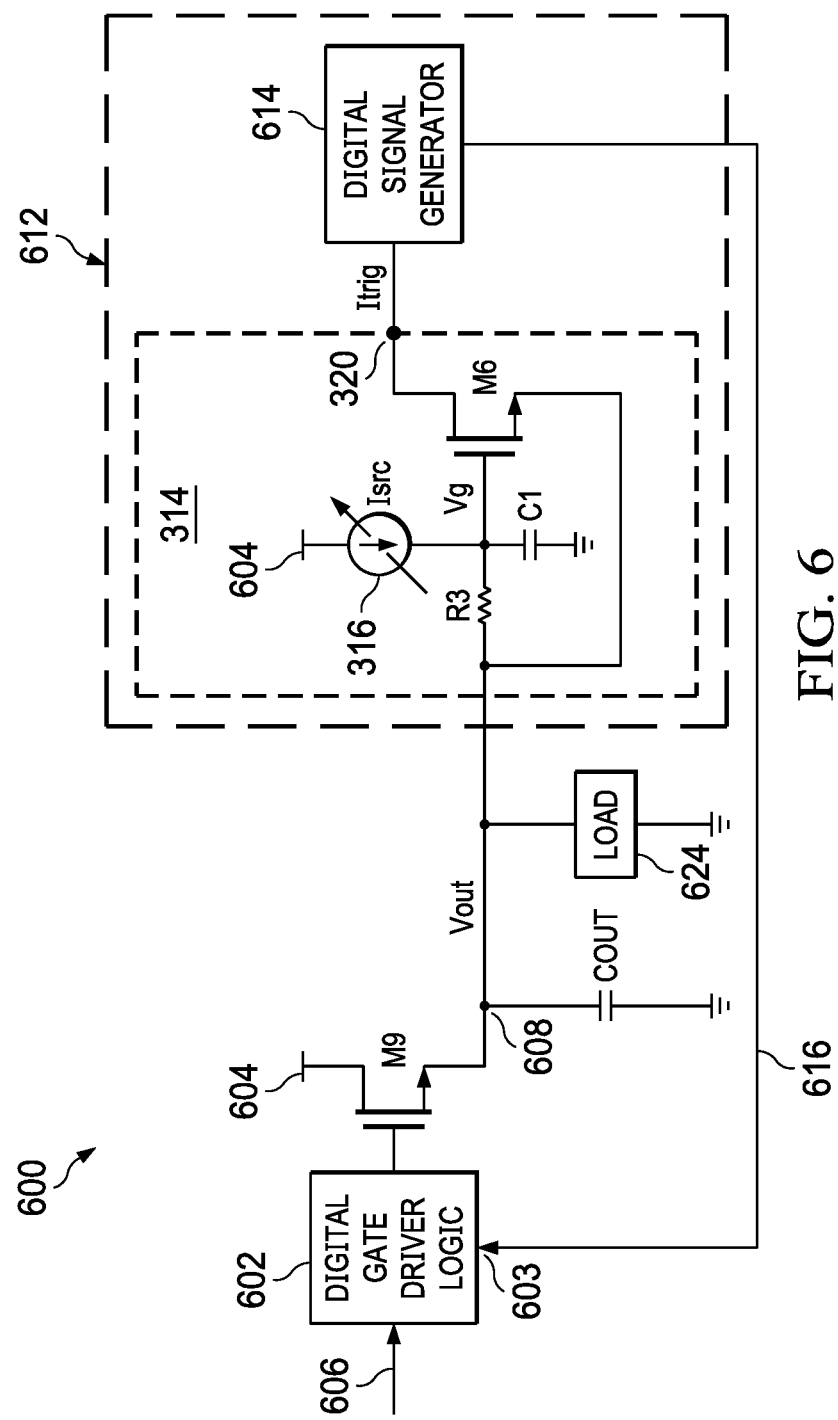
FIG. 6 is a schematic diagram showing a circuit with a power switch and a short-to-ground protection circuit in accordance with an example embodiment.

FIG. 6 is a schematic diagram showing a circuit 600 with a pass FET in the form of a power switch (M9) and with another short-to-ground protection circuit 612 in accordance with an example embodiment. As shown, a first current terminal of M9 is coupled to a voltage supply node 604, the control terminal of M9 is coupled to digital gate driver logic 602, and the second current terminal of M9 is coupled to an output node 608. In the example of FIG. 6, the output node 608 is coupled to the short-to-ground protection circuit 612, COUT, and a load 624 in parallel with COUT.

The short-to-ground protection circuit 612 includes M6, R3, C1, the current source 314, and the control node 320 in the arrangement described in FIG. 3. In the example of FIG. 6, a digital signal generator 614 is coupled to the control node 320 to convert the Itrig at the control node 320 into a digital control signal 616, which is provided to an input node 603 of the digital gate driver logic 602 to turn M1 off. As shown, the digital gate driver logic 602 also receives other control signals 606, which determine when to turn M1 on or off. Regardless of the state of the control signals 606, the digital control signal 616 is able to turn off M1 as needed in response to a short-to-ground event. In operation, the short-to-ground protection circuit 612 is configured to sense a short-to-ground event, where the digital signal generator 614 is configured to generate a digital signal (e.g., the digital control signal 616) based on a control current (e.g., Itrig in FIG. 6), and where M1 is turned off in response to the digital signal being generated.

Figure 7:
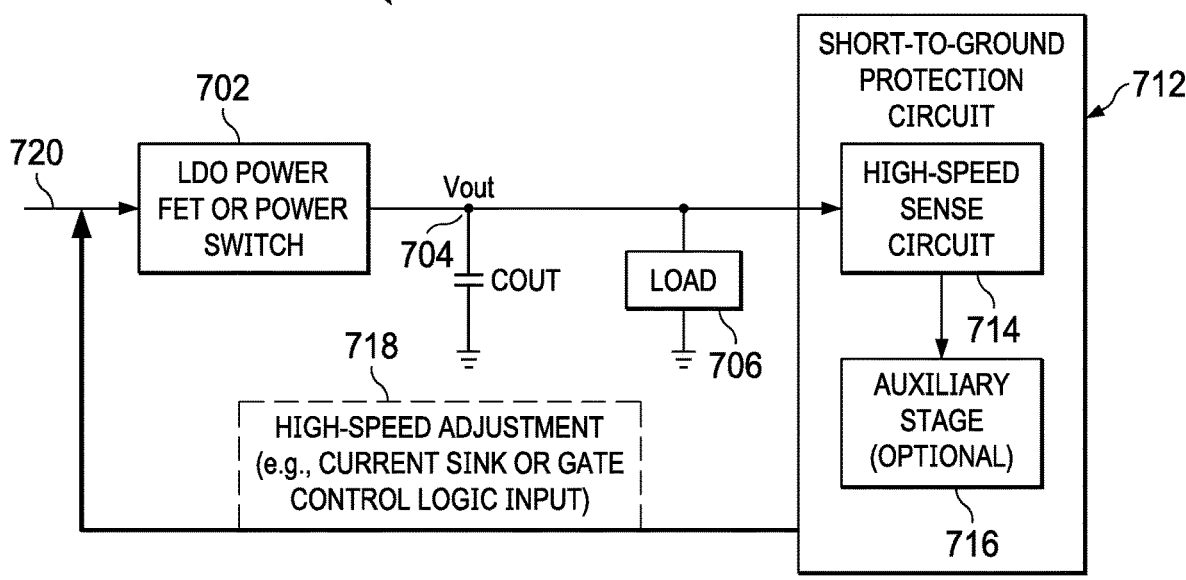
FIG. 7 is a block diagram showing a system with a pass field-effect transistor (FET) short-to-ground protection circuit in accordance with an example embodiment.

FIG. 7 is a block diagram showing a system 700 in accordance with an example embodiment. As shown, the system 700 includes a power control circuit 702 (e.g., with an LDO pass FET such as M1 in FIG. 3, or a power switch such as M9 as in FIG. 6). The output of the power control circuit 702 702 is provided to an output node 704. In the example of FIG. 7, the output node 704 is coupled to a short-to-ground protection circuit 712, COUT, and a load 706 in parallel with COUT.

As shown, the short-to-ground protection circuit 712 includes a high-speed sense circuit 714 (e.g., the sense circuit 314 in FIGS. 3 and 6). In some example embodiments, the short-to-ground protection circuit 712 also includes an auxiliary stage 716 such as a gain stage (e.g., the gain stage 317 in FIG. 3) or a digital signal generator (e.g., the digital signal generator 614 in FIG. 6). The output of the short-to-ground protection circuit 712 is a high-speed adjustment 718 (e.g., a current sink such as Itrig1 or Itrig2 as in FIG. 3, or a digital control signal 616 as in FIG. 6), which adjusts a control signal 720 for the pass FET 702.

In some example embodiments, a system or integrated circuit (IC) includes a power supply source or node (e.g., the voltage supply node 106 in FIG. 3, or the voltage supply node 604 in FIG. 6) and a power control circuit (e.g., the power control circuit 702 in FIG. 7) coupled to the power supply source or node, where the power control circuit includes a pass FET (e.g., M1 in FIG. 3, M9 in FIG. 6). The IC also includes a short-to-ground protection circuit (e.g., the short-to-ground protection circuit 312 in FIG. 3, or the short-to-ground protection circuit 612 in FIG. 6) coupled to an output of the pass FET. The short-to-ground protection circuit includes a sense circuit (e.g., the sense circuit 314 in FIGS. 3 and 6, or the high-speed sense circuit 714 in FIG. 7) coupled to the output of the pass FET and configured to induce a control current (e.g., Itrig1 or Itrig2 in FIG. 3, or Itrig in 6) in response to a magnitude and a change rate of a voltage drop at the output of the pass FET being greater than respective thresholds for the magnitude and the change rate. The control current is used to turn off the pass FET.

In some example embodiments, the sense circuit includes a transistor (e.g., M6 in FIGS. 3 and 6), a resistor (e.g., R3 in FIGS. 3 and 6) coupled between a gate of the transistor and an output of the pass FET, and a capacitor (e.g., C1 in FIGS. 3 and 6) coupled between the gate of the transistor and a ground node. The sense circuit also includes a programmable current source (e.g., the current source 316 in FIGS. 3 and 6) coupled to the gate of the transistor, where a first current terminal of the transistor is coupled to an output node (e.g., the control node 320 in FIGS. 3 and 6) of the sense circuit, and a second current terminal of the transistor is coupled to the output of the pass FET.

In some example embodiments, the short-to-ground protection circuit includes a gain stage (e.g., the gain stage 317 in FIG. 3) coupled to the control node (e.g., the control node 320 in FIG. 3), where an output of the gain stage is coupled to the gate of the pass FET. In some example embodiments, the gain stage includes a first transistor (e.g., M7 in FIG. 3) with a control terminal coupled to the control node, with a first current terminal coupled to the power supply source or node, and with a second current terminal coupled to a control terminal of a second transistor (e.g., M8 in FIG. 3). The gain stage also includes a first resistor (e.g., R4 in FIG. 3) coupled between the power supply source or node and the control node. The gain stage also includes a second resistor (e.g., R5 in FIG. 3) coupled between the second current terminal of the first transistor and a ground node, where a first current terminal of the second transistor is coupled to a control terminal of the pass FET, and a second current terminal of the second transistor is coupled to a ground node. In some example embodiments, the gain stage includes a latch (e.g., the latch 318 in FIG. 3) coupled between the second current terminal of the first transistor and the control terminal of the second transistor.

In some example embodiments, the power control circuit includes a power switch (e.g., M9 in FIG. 6), where the short-to-ground protection circuit includes a digital signal generator (e.g., the digital signal generator 614 in FIG. 6) configured to generate a digital signal (e.g., the digital control signal 616 in FIG. 6) based on the control current (e.g., Itrig in FIG. 6). The pass FET is turned off in response to the digital signal being generated.

In some example embodiments, the digital signal generator includes: a sense resistor coupled to the output node of the sense circuit (e.g., the control node 320 in FIG. 6) and configured to provide a voltage based on the control current (e.g., Itrig in 6); and a comparator or Schmitt trigger coupled to the sense resistor and configured to compare the voltage with a reference. In other examples, the digital signal generator includes: a sense resistor coupled to the output node of the sense circuit and configured to provide a voltage based on the control current; and an inverter coupled to the sense resistor. In other example embodiments, the components used by the digital signal generator to generate the digital signal varies.

In some example embodiments, the power control circuit (e.g., the power control circuit 702 in FIG. 7) includes a low dropout regulator (e.g., the LDO 102 in FIG. 3), where the output node of the sense circuit (e.g., the control node 320 in FIG. 3) is coupled to a gate of the pass FET (e.g., M1 in FIG. 3). In some example embodiments, the short-to-ground protection circuit includes a gain stage (e.g., the gain stage 317 in FIG. 3) coupled to the output node of the sense circuit, where an output of the gain stage (e.g., the output node 322 in FIG. 3) is coupled to the gate of the pass FET.

In some example embodiments, a circuit includes a pass FET (e.g., M1 in FIG. 3, or M9 in FIG. 6). The circuit also includes a short-to-ground protection circuit (e.g., the short-to-ground protection circuit 312 in FIG. 3, or the short-to-ground protection circuit 612 in FIG. 6) coupled to an output of the pass FET. The short-to-ground protection circuit includes a transistor (e.g., M6 in FIGS. 3 and 6), a resistor (e.g., R3 in FIGS. 3 and 6) coupled between a gate of the transistor and an output of the pass FET, a capacitor (e.g., C1 in FIGS. 3 and 6) coupled between the gate of the transistor (e.g., M6) and a ground node. The short-to-ground protection circuit also includes a current source (e.g., the current source 316 in FIGS. 3 and 6) coupled to the gate of the transistor (e.g., M6), where a first current terminal of the transistor is coupled to a control node (e.g., node 320 in FIGS. 3 and 6), and a second current terminal of the transistor (e.g., M6) is coupled to the output of the pass FET.

In some example embodiments, the pass FET is a power switch, the short-to-ground protection circuit includes a digital signal generator (e.g., the digital signal generator 614 in FIG. 6) configured to generate a digital signal (e.g., the digital control signal 616 in FIG. 6) based on a control current (e.g., Itrig in FIG. 6) at the control node, and the pass FET is turned off in response to the digital signal being generated. In some example embodiments, the pass FET is part of an LDO (e.g., the LDO 102 in FIG. 3), and the control node is coupled to a gate of the pass FET. In some example embodiments, the pass FET is part of an LDO, and the short-to-ground protection circuit includes a gain stage (e.g., the gain stage 317 in FIG. 3) coupled between the control node and a gate of the pass FET. In some example embodiments, the current source (e.g., the current source 316 in FIG. 3) is programmable.

With the proposed short-to-ground protection circuit, the response to a short-to-ground event is much faster that other short-to-ground protection circuits, and will sharply reduce the duration of the high current surge down to below 150 ns. Also, the proposed short-to-ground protection circuit detects the output voltage profile instead of the current profile, which is used in a typical current limit circuit. The delay and trigger voltage, based on short-to-ground $$\frac{dv}{dt},$$

are designed with large voltage overdrive circuitry to reduce the response time. Also, the proposed short-to-ground protection circuit senses both the magnitude and change rate of the pass FET output voltage drop which is more relevant to a short-to-ground event. This solution will give the pass FET better protection, especially for NMOS type pass FET, when output is shorted to ground during operation.

Certain terms have been used throughout this description and claims to refer to particular system components. As one skilled in the art will appreciate, different parties may refer to a component by different names. This document does not intend to distinguish between components that differ only in name but not in their respective functions or structures. In this disclosure and claims, the terms "including" and "comprising" are used in an open-ended fashion, and thus should be interpreted to mean "including, but not limited to . . . ."

The term "couple" is used throughout the specification. The term may cover connections, communications, or signal paths that enable a functional relationship consistent with the description of the present disclosure. For example, if device A generates a signal to control device B to perform an action, in a first example device A is coupled to device B by direct connection, or in a second example device A is coupled to device B through intervening component C if intervening component C does not alter the functional relationship between device A and device B such that device B is controlled by device A via the control signal generated by device A.

The above discussion is meant to be illustrative of the principles and various embodiments of the present invention. Numerous variations and modifications will become apparent to those skilled in the art once the above disclosure is fully appreciated.

What is claimed is:

1. A system, comprising:
   a power supply source;
   a power control circuit coupled to the power supply source, in which the power control circuit includes a pass field-effect transistor (FET);
   a short-to-ground protection circuit coupled to an output of the pass FET, in which the short-to-ground protection circuit includes:
      a sense circuit configured to detect when a magnitude and a change rate of a voltage drop at the output of the pass FET crosses respective thresholds for the magnitude and the change rate;
      a control node at the output of the sense circuit, in which the sense circuit is configured to induce a control current at the control node in response to the magnitude and the change rate of a voltage drop at the output of the pass FET crossing the respective thresholds, and the control current is used to turn off the pass FET.

2. The system of claim 1, in which the sense circuit includes:
   a transistor;
   a resistor coupled between a gate of the transistor and an output of the pass FET;
   a capacitor coupled between the gate of the transistor and a ground node; and
   a current source coupled to the gate of the transistor, where a first current terminal of the transistor is coupled to the control node and a second current terminal of the transistor is coupled to the output of the pass FET.

3. The system of claim 2, in which the current source is programmable.

4. The system of claim 2, in which the power control circuit is a power switch, the short-to-ground protection circuit includes a digital signal generator configured to generate a digital signal based on the control current, and the pass FET is turned off in response to the digital signal being generated.

5. The system of claim 4, further comprising digital gate driver logic coupled to a control terminal of the pass FET, where the digital gate driver logic includes an input node coupled to an output of the digital signal generator.

6. The system of claim 2, in which the power control circuit is a low dropout regulator, and the control node is coupled to a gate of the pass FET.

7. The system of claim 6, in which the short-to-ground protection circuit includes a gain stage coupled to the control node, and an output of the gain stage is coupled to the gate of the pass FET.

8. The system of claim 7, in which the gain stage includes:
   a first transistor with a control terminal coupled to the control node, with a first current terminal coupled to the power supply source, and with a second current terminal coupled to a control terminal of a second transistor;
   a first resistor coupled between the power supply source and the control node; and
   a second resistor coupled between the second current terminal of the first transistor and a ground node, where a first current terminal of the second transistor is coupled to a control terminal of the pass FET and a second current terminal of the second transistor is coupled to a ground node.

9. The system of claim 8, in which the gain stage further includes a latch coupled between the second current terminal of the first transistor and the control terminal of the second transistor.

10. An integrated circuit, comprising:
    a power supply node;
    a power control circuit coupled to the power supply node, in which the power control circuit includes a pass field-effect transistor (FET);
    a short-to-ground protection circuit coupled to an output of the pass FET, in which the short-to-ground protection circuit includes:
       a sense circuit coupled to the output of the pass FET and configured to induce a control current in response to a magnitude and a change rate of a voltage drop at the output of the pass FET crossing respective thresholds for the magnitude and the change rate, in which the control current is used to turn off the pass FET.

11. The integrated circuit of claim 10, in which the sense circuit includes:
    a transistor;
    a resistor coupled between a gate of the transistor and an output of the pass FET;
    a capacitor coupled between the gate of the transistor and a ground node; and
    a programmable current source coupled to the gate of the transistor, where a first current terminal of the transistor is coupled to an output node of the sense circuit and a second current terminal of the transistor is coupled to the output of the pass FET.

12. The integrated circuit of claim 11, in which the power control circuit includes a power switch, the short-to-ground protection circuit includes a digital signal generator configured to generate a digital signal based on the control current, and the pass FET is turned off in response to the digital signal being generated.

13. The integrated circuit of claim 12, in which the digital signal generator includes:
   a sense resistor coupled to the output node of the sense circuit and configured to provide a voltage based on the control current; and
   a comparator or Schmitt trigger coupled to the sense resistor and configured to compare the voltage with a reference.

14. The integrated circuit of claim 12, in which the digital signal generator includes:
   a sense resistor coupled to the output node of the sense circuit and configured to provide a voltage based on the control current; and
   an inverter coupled to the sense resistor.

15. The integrated circuit of claim 11, in which the power control circuit includes a low dropout regulator, and the output node of the sense circuit is coupled to a gate of the pass FET.

16. The integrated circuit of claim 15, in which the short-to-ground protection circuit includes a gain stage coupled to the output node of the sense circuit, and an output of the gain stage is coupled to the gate of the pass FET.

17. A circuit, comprising:
   a pass field-effect transistor (FET);
   a short-to-ground protection circuit coupled to an output of the pass FET, in which the short-to-ground protection circuit includes:
      a transistor;
      a resistor coupled between a gate of the transistor and an output of the pass FET;
      a capacitor coupled between the gate of the transistor and a ground node; and
      a current source coupled to the gate of the transistor, where a first current terminal of the transistor is coupled to a control node, and a second current terminal of the transistor is coupled to the output of the pass FET.

18. The circuit of claim 17, in which the pass FET is a power switch, the short-to-ground protection circuit includes a digital signal generator configured to generate a digital signal based on a control current at the control node, and the pass FET is turned off in response to the digital signal being generated.

19. The circuit of claim 17, in which the pass FET is part of a low dropout regulator and the control node is coupled to a gate of the pass FET.

20. The circuit of claim 17, in which the pass FET is part of a low dropout regulator, and the short-to-ground protection circuit includes a gain stage coupled between the control node and a gate of the pass FET.

21. The circuit of claim 17, in which the current source is programmable.

* * * * *